(12) United States Patent
Schenkewitz

(10) Patent No.: US 9,671,894 B2
(45) Date of Patent: Jun. 6, 2017

(54) GLOVE DETECTION/ADJUSTMENT OF SENSITIVITY FOR CAPACITIVE SENSING BUTTON AND SLIDER ELEMENTS

(75) Inventor: Christian Schenkewitz, Singapore (SG)

(73) Assignee: Continental Automotve GmbH, Hannover (DE)

( * ) Notice: Subject to any disclaimer, the term of this patent is extended or adjusted under 35 U.S.C. 154(b) by 1 day.

(21) Appl. No.: 14/405,331

(22) PCT Filed: Jun. 4, 2012

(86) PCT No.: PCT/IB2012/052793
§ 371 (c)(1),
(2), (4) Date: Dec. 19, 2014

(87) PCT Pub. No.: WO2013/182868
PCT Pub. Date: Dec. 12, 2013

(65) Prior Publication Data
US 2015/0123937 A1    May 7, 2015

(51) Int. Cl.
| | | |
|---|---|---|
| *G06F 3/045* | (2006.01) | |
| *G06F 3/041* | (2006.01) | |
| *H03K 17/96* | (2006.01) | |
| *H03K 17/955* | (2006.01) | |
| *G06F 3/044* | (2006.01) | |

(52) U.S. Cl.
CPC ............ *G06F 3/0416* (2013.01); *G06F 3/044* (2013.01); *H03K 17/955* (2013.01); *H03K 17/962* (2013.01); *B60K 2350/1012* (2013.01); *B60K 2350/1036* (2013.01); *G06F 2203/04101* (2013.01); *G06F 2203/04106* (2013.01); *H03K 2217/94026* (2013.01)

(58) Field of Classification Search
CPC .................. G06F 3/0416; G06F 3/044; G06F 2203/04101; G06F 2203/04106; H03K 17/955; H03K 17/962; H03K 2217/94026; B60K 2350/1012; B60K 2350/1036
USPC ........................................................ 345/174
See application file for complete search history.

(56) References Cited

U.S. PATENT DOCUMENTS

2005/0231360 A1    10/2005 Fujimori et al.
2006/0019724 A1    1/2006 Bahl et al.
(Continued)

FOREIGN PATENT DOCUMENTS

JP    04-128684    4/1992
JP    10-308149    11/1998
(Continued)

*Primary Examiner* — Mark Regn
(74) *Attorney, Agent, or Firm* — Cozen O'Connor

(57) ABSTRACT

An input device for a control system of a vehicle includes at least one capacitive-sensing button, an actuation detection electrical circuit, a proximity sensor, a proximity temperature sensor, and a processor. In use, the capacitive-sensing button receives an actuation from a user. The actuation alters a capacitance value of the button. The detection electrical circuit comprises a threshold value and it outputs a button actuation signal when the capacitance value exceeds the threshold value. The proximity sensor generates a proximity signal when an object is provided near the capacitive-sensing button. The proximity temperature sensor provides a temperature measurement of the nearby area. The processor adjusts the threshold value to an adjustment value that is derived from the comparison signal.

13 Claims, 7 Drawing Sheets

(56) References Cited

U.S. PATENT DOCUMENTS

| | | | |
|---|---|---|---|
| 2008/0252613 A1* | 10/2008 | Chuang | G06F 3/041 345/174 |
| 2009/0219175 A1 | 9/2009 | Takashima et al. | |
| 2009/0260898 A1 | 10/2009 | Jin et al. | |
| 2010/0149110 A1* | 6/2010 | Gray | G06F 3/0416 345/173 |
| 2010/0258361 A1 | 10/2010 | Yamauchi et al. | |
| 2012/0313648 A1* | 12/2012 | Salter | H03K 17/955 324/647 |
| 2013/0001058 A1* | 1/2013 | Bowler | H03K 17/962 200/600 |

FOREIGN PATENT DOCUMENTS

| | | |
|---|---|---|
| JP | 2007 027034 | 2/2007 |
| JP | 2007-027034 | 2/2007 |
| JP | 2007-329866 | 12/2007 |
| JP | 2009-212719 | 9/2009 |
| JP | 2009-217956 | 9/2009 |

\* cited by examiner

GLOVE DETECTION/ADJUSTMENT OF SENSITIVITY FOR CAPACITIVE SENSING BUTTON AND SLIDER ELEMENTS

CROSS-REFERENCE TO RELATED APPLICATIONS

This is a U.S. national stage of application No. PCT/IB2012/052793, filed on 4 Jun. 2012, the content of which is incorporated herein by reference.

BACKGROUND OF THE INVENTION

1. Field of the Invention

This application relates to a capacitive-sensing device and to an actuation of the capacitive-sensing device.

2. Related Art

Capacitive-sensing devices are widely used in modern electronic devices. For example, capacitive-sensing devices are employed in music and other media players, cell phones and other communication devices, remote controls, and Personal Digital Assistants (PDAs). These capacitive-sensing devices comprise sensing regions to receive user actuation inputs for selecting system functions. These user actuation inputs can be provided via one or more fingers, styli, other objects, or a combination thereof.

SUMMARY OF THE INVENTION

It is an object of the application to provide an improved capacitive-sensing device.

It is believed that the capacitive-sensing device can be improved by adjusting its actuation sensitivity according to types of actuation. The types of actuation include actuation by bare fingers and actuation by fingers that are covered by a glove.

The application provides an input device for a control system of a motor vehicle. Examples of the motor vehicle include a car, a bus, and a truck, which are used for transporting passengers and goods.

The input device includes one or more capacitive-sensing buttons that are electrically connected to an actuation detection electrical circuit. The input device also includes a proximity sensor and a proximity temperature sensor. The proximity sensor and proximity temperature sensor are placed near the capacitive-sensing buttons and are electrically connected to a processor. The processor includes a comparison unit and an adjustment unit.

In particular, the capacitive-sensing button is intended for receiving an actuation from a user. The user often provides the actuation in the form of a touch. The actuation acts to alter a capacitance charge value of the capacitive-sensing button. In contrast, the actuation detection electrical circuit has a threshold value and it outputs a button actuation signal when its capacitance charge value exceeds the threshold value. The threshold value can be implemented as data that is stored in computer memory or it can be implemented as a characteristic of a hardware part, such as a breakdown voltage of a zener diode.

As an example, when the user touches a capacitive-sensing button, the user alters the capacitive charge of the capacitive-sensing button by discharging its capacitive charge. The threshold value is configured such that this discharge by the user would exceed the threshold value and thereby causes the actuation detection electrical circuit to output a button actuation signal.

The proximity sensor generates a proximity signal when an object is placed in an area that is near the capacitive-sensing button. Often, the object refers to the hand of the user. The proximity temperature sensor measures a temperature of this nearby area and it often uses infra-red techniques for the measurement.

Referring to the processor, the comparison unit is used for receiving the temperature measurement from the proximity temperature sensor and for receiving the proximity signal from the proximity sensor. After this, the comparison unit generates a comparison signal that is derived from the received temperature measurement and from the received proximity signal. The adjustment unit later receives the comparison signal from the comparison unit and it then derives an adjustment value from the comparison signal. Subsequently, the adjustment unit adjusts the threshold value of the actuation detection electrical circuit to the derived adjustment value.

The input device benefits from the dynamic adjustment of the threshold value of the actuation detection electrical circuit. In practice, a static threshold value is often not suitable for different types of object, which actuates the capacitive-sensing buttons. A threshold value that is suitable for button actuation using bare fingers is often not suitable for button actuation using fingers covered by a glove. Similarly, a threshold value that is suitable for button actuation using fingers covered by a glove is often not suitable for button actuation using bare fingers. This is different from the application, which provides a dynamic threshold value that can be adapted to different types of button actuation objects.

In one aspect of the application, the capacitive-sensing button provides the proximity sensor signal. In another words, the capacitive-sensing button includes the functions of the proximity sensor. An object, which is provided near to a capacitive-sensing button, would alter the electromagnetic field of the capacitive-sensing button, which would in turn alter the capacitance of the capacitive-sensing button. This change of capacitance can then be used to sense that the object is placed nearby and can then be used to generate the proximity sensor signal.

Different ways of implementing the comparison unit are possible.

In one implementation, the comparison unit comprises a module for generating the comparison signal. The comparison signal generation is based on a predetermined mathematical comparison function of the temperature measurement and of the proximity signal. In a second implementation, the comparison unit comprises another module for generating the comparison signal, wherein a value of the comparison signal is selected from a set of pre-determined comparison values. The selection is based on the temperature measurement and on the proximity signal.

The comparison unit can generate a null signal when the proximity signal is absent. In other words, the comparison unit does not generate the comparison signal when the proximity sensor does not detect any object near the capacitive-sensing buttons.

The comparison unit may also generate a null signal when the temperature measurement of the object near the capacitive-sensing buttons is less than the ambient temperature. In other words, the comparison unit does not generate any signal when this object has a temperature that is less than ambient temperature.

It is assumed that the object is not the fingers of the user when this object has a temperature that is less than ambient temperature. Often, the capacitive-sensing buttons are intended for actuating by fingers of the user. The bare fingers usually have a temperature that is higher ambient temperature while fingers, which are covered by a glove, usually have a temperature that is about the same as ambient temperature.

Similar to the comparison unit, different ways of implementing the adjustment unit are possible. In one implementation, the adjustment unit comprises a module for determining the adjustment value. The determination is based on a predetermined mathematical adjustment function of the comparison signal. In another implementation, the adjustment unit comprises a different module for selecting the adjustment value from a set of pre-determined comparison values based on the comparison signal.

According to one aspect of the application, the comparison unit generates a pre-determined low sensitivity threshold comparison signal when the temperature measurement exceeds a temperature measurement, which corresponds to an ambient temperature. The adjustment unit, upon receipt of the pre-determined low sensitivity threshold comparison signal, changes the threshold value of the actuation detection electrical circuit to a pre-determined low sensitivity threshold value.

It is assumed that the object comprises a bare finger, since the hand is often warm with respect to the ambient temperature. The threshold value of the actuation detection electrical circuit is then set to low sensitivity for detecting button actuation by bare fingers.

The comparison unit can generate a pre-determined high sensitivity threshold comparison signal when the temperature measurement is approximately the same as a temperature measurement, which corresponds to an ambient temperature. The adjustment unit, upon receipt of the pre-determined high sensitivity threshold comparison signal, changes the threshold value of the actuation detection electrical circuit to a pre-determined high sensitivity threshold value.

In this case, it is assumed that the object comprises a finger being covered by a glove. The threshold value of the actuation detection electrical circuit is then set to high sensitivity for detecting button actuation by fingers covered by a glove.

An external temperature sensor can provide the temperature measurement that corresponds to the ambient temperature. The proximity temperature sensor can also provide this temperature measurement using temperature measurements taken over a predetermined period.

The proximity temperature sensor may measure a surface temperature of the object when the proximity signal is generated. In other words, the proximity temperature sensor measures the temperature of the object when the object is detected near to the capacitive-sensing button.

The proximity temperature sensor may also be used to measure the ambient temperature. This occurs when no object is placed near the capacitive-sensing buttons. In this case, the temperature measurement of the proximity temperature sensor would then refer to the temperature measurements of the surrounding of the capacitive-sensing buttons, which corresponds to ambient temperature.

The application provides a control module of a vehicle. The control module includes the above input device and a control unit. The control unit comprises a set of pre-determined system function selection signals. In use, the input device receives an actuation from a user, which it then outputs a button actuation signal to the control unit. The control unit provides a system function selection signal, which is selected from the set of pre-determined system function selection signals. The selection is done according to the button actuation signal.

The application provides a radio module of a vehicle. The radio module has the above control system and a tuner module. The control system is used for providing a radio function selection signal. The tuner module receives the radio function selection signal and it provides a radio function according to the radio function selection signal.

The application provides an air conditioning module of a vehicle. The air conditioning module includes the above control system and an air conditioning unit. The control system is used for providing an air conditioning selection signal. The air conditioning unit receives the air conditioning selection signal and it provides an air conditioning function according to the air conditioning function selection signal.

The application provides a navigation module of a vehicle. The navigation module includes the above control system and a navigation unit. The control system is used for providing a navigation function selection signal. The navigation unit receives the navigation function selection signal and it provides a navigation function according to the navigation function selection signal.

The application provides a method of operating an input device for a control system of a vehicle.

The method includes a step of generating a proximity signal when an object is provided in an area that is near a capacitive-sensing button. A temperature measurement of the object is then obtained when the proximity signal is generated. After this, the temperature measurement of the area is compared against the ambient temperature. A button actuation threshold value can be afterward selected from a set of pre-determined threshold values. Alternatively, the button actuation threshold value can be computed at runtime or during use. The selection is done according to the comparison between the temperature measurement of the object and the ambient temperature. A threshold value of an actuation detection electrical circuit of the capacitive-sensing button is later adjusted according to the button actuation threshold value.

The method often includes a step of generating a button actuation signal when an actuation of the capacitive-sensing button changes a capacitance charge of the capacitive-sensing button such that the change of the capacitance charge exceeds the threshold value of the actuation detection electrical circuit.

BRIEF DESCRIPTION OF THE DRAWINGS

The invention will be explained in detail below on the basis of an exemplary embodiment in conjunction with the drawings, in which.

DETAILED DESCRIPTION OF THE PRESENTLY PREFERRED EMBODIMENTS

In the following description, details are provided to describe embodiments of the application. It shall be apparent to one who is skilled in the art, however, that these embodiments may be practiced without such details.

Some parts of the embodiments, which are shown in the figures, have similar parts. The similar parts may have the same names or similar part numbers. The description of one similar part also applies by reference to other similar parts, where appropriate, thereby reducing repetition, of text without limiting the disclosure.

Figure 1:
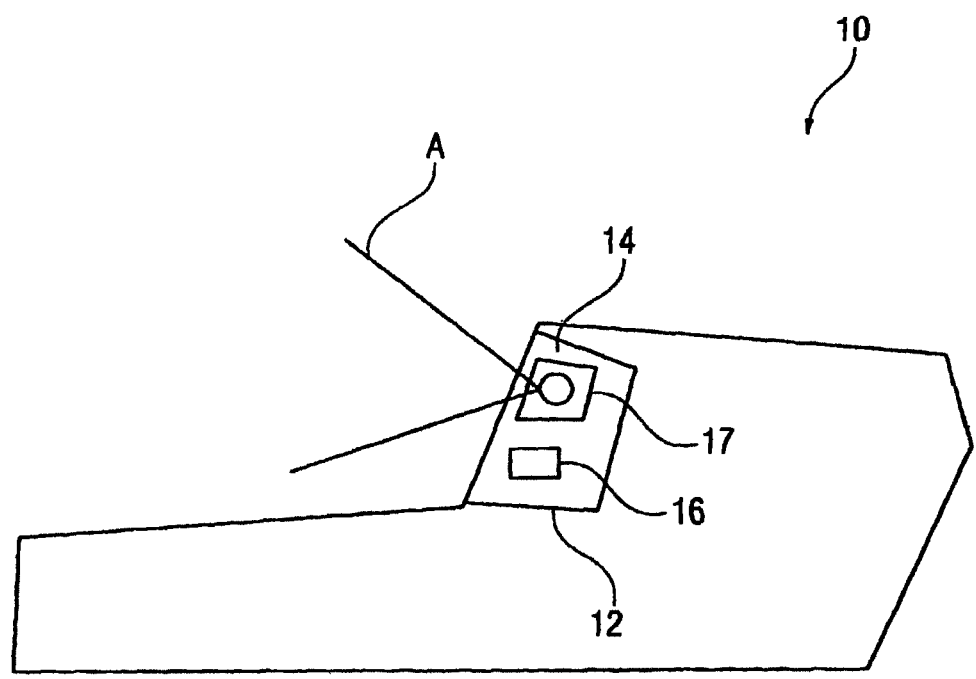
FIG. 1 illustrates an Integrated Center Stack (ICS) of a car.

FIG. 1 shows a car 10, which includes an Integrated Center Stack (ICS) 12, which includes a car radio. The radio is not shown in FIG. 1. The ICS 12 comprises a face plate 14 with an external surface, a display panel 16, and a control console 17. The control console 17 is also called an input device. The display panel 16 and the control console 17 are placed on the external surface of the face plate 14.

Figure 2:
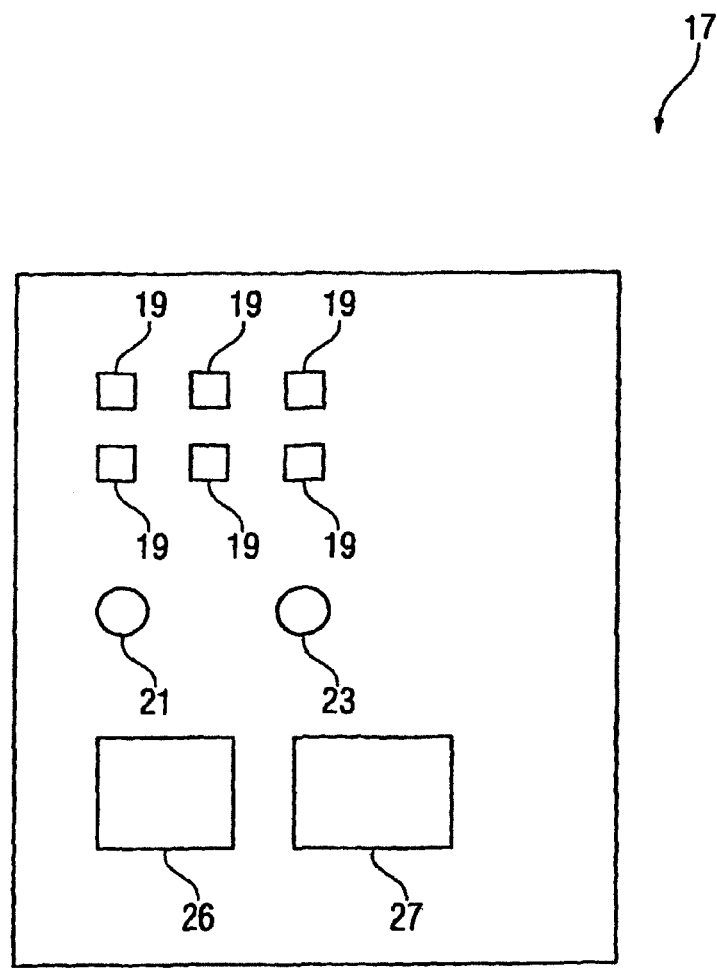
FIG. 2 is an input device of a car radio of the ICS of FIG. 1.

As seen in FIG. 2, the input device 17 comprises a plurality of capacitive-sensing buttons 19, an infra-red (IR) sensor 21, a proximity sensor 23, as well as a processor 26 together with an integrated memory module 27. The capacitive-sensing buttons 19 are also called capacitive touch buttons or capacitive buttons. The capacitive buttons 19, the IR sensor 21, the proximity sensor 23, and the integrated memory module 27 are electrically connected to the processor 26.

The capacitive buttons 19, the IR sensor 21 and the proximity sensor 23 are placed on an external surface of the input device 17 of the ICS face plate 14.

In a general use, the car 10 can be replaced by a commercial vehicle, like a truck or lorry.

Figure 3:
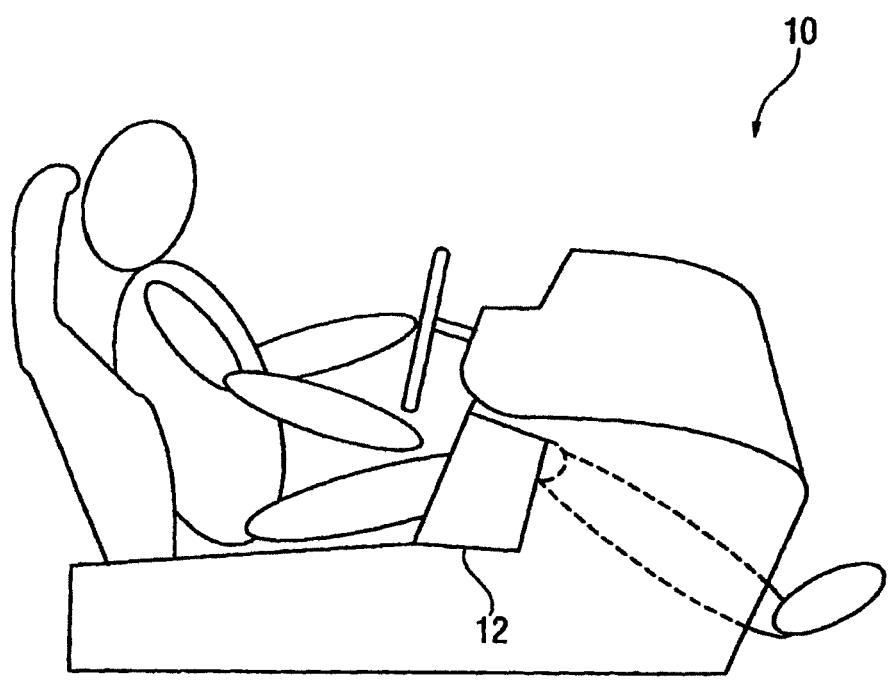
FIG. 3 illustrates a driver being seated inside the car and being seated next to the ICS of FIG. 1.

In use, the ICS 12 is installed in a central portion of the car 10 along its longitudinal axis. The ICS 12 is also placed between a driver and a front passenger of the car 10, as illustrated in FIG. 3. The car 10 is used for transporting passengers.

The ICS 12 serves as a Human Machine Interface (HMI) for the radio of the car 10. The radio provides contents from a radio station for passengers of the car 10. The input device 17 receives inputs or actuations from a user to select a function of the radio. The received inputs are afterward sent to the processor 26. The display panel 16 shows the present status of the radio. In practice, the display panel 16 may also show status of other components of the car 10, such as Heating, Ventilation, and Air-Conditioning (HVAC) controllers and navigation devices.

The IR sensor 21 has a viewing angle A, which is also called a temperature sensing angle. The IR sensor 21 is positioned such that the viewing angle A is directed towards a nearby object, which is placed in front of and near any one of the capacitive buttons 19 of the input device 17. The IR sensor 21 measures surface temperature of this nearby object. The surface temperature measurement is generated before the object touches the capacitive buttons 19. The measured temperature reading is afterward transmitted to the processor 26.

Figure 6:
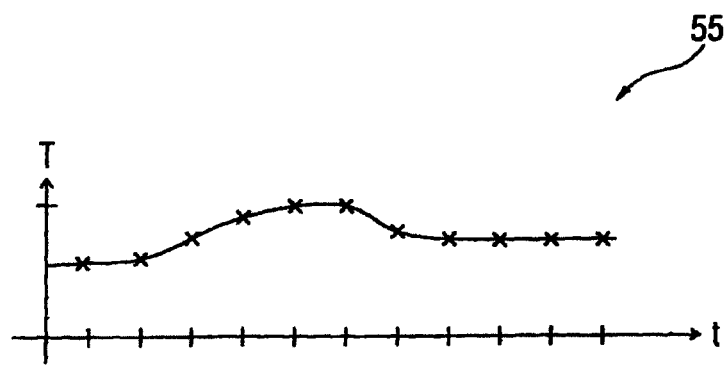
FIG. 6 illustrates a temperature graph of the car radio of the ICS of FIG. 1.

Moreover, the IR sensor 21 is also used to measure ambient temperature inside the car 10. The IR sensor 21 obtains a plurality of temperature measurements at a certain interval over a certain period, as illustrated in FIG. 6, which shows a graph 55 of the surrounding temperature. These temperature measurements are then averaged to determine the ambient temperature. The measured ambient temperature reading is later transmitted to the processor 26.

In a generic sense, another temperature sensor of the car, instead of the IR sensor 21, can also be used to determine the ambient temperature.

The proximity sensor 23 is positioned such that it provides a proximity detection signal when an object is placed close to any one of the capacitive buttons 19 of the input device 17. The proximity detection signal is generated before the object touches the capacitive buttons 19. In short, the proximity detection signal is provided once the object is placed near one of the capacitive buttons 19. The generated proximity detection signal is then transmitted to the processor 26.

The capacitive buttons 19 are used for receiving a touch from a user, wherein the user touch is used to indicate a button actuation. In effect, the touch changes a capacitance of the respective button 19. This capacitance change is then used by a detection chipset or the detection electric circuits of the capacitive buttons 19 to identify the button actuation. These detection electric circuits have a detection threshold, which is set such that a detection signal is generated when the capacitance change exceeds the detection threshold.

If the detection threshold is low, then only a small capacitance change is needed to generate the detection signal. This means that the detection circuit has high detection sensitivity. On the other hand, if the detection threshold is high, then a large capacitance change is needed to generate the detection signal. In other words, the detection circuit has low detection sensitivity.

The processor 26 receives the above-mentioned object surface temperature measurement from the IR sensor 21 and the object proximity detection signal from the proximity sensor 23.

The processor 26 then adjusts the detection threshold of the detection electric circuits of the capacitive buttons 19 according the received object surface temperature measurement and the received object proximity detection signal. This allows the buttons 19 to adapt its button actuation sensitivity according to the different manner of actuation.

If the processor 26 would adjust the button detection threshold higher, the buttons 19 would then have lower detection sensitivity. Put differently, a smaller capacitance change is required to actuate the buttons 19.

On the other hand, if the processor 26 would adjust the button detection threshold lower, the buttons 19 would then have higher detection sensitivity. In other words, a smaller capacitance change is required to actuate the buttons 19. In cold weather, the users often wear gloves, which, because of their inherent property, often induce a smaller change of capacitance.

These low and the high thresholds are selected such that the detection electrical circuits are not driven to saturation. In short, the thresholds are placed within operating range of detection electrical circuits.

In application, a screen touch slider can comprise a plurality of capacitive buttons 19 that are arranged in a line next to each other. When one capacitive button 19 of the slider is actuated, the capacitive buttons 19 of the slider are disabled. Operationally, this screen touch slider acts as a mechanical slider.

In a general sense, the embodiment can also include more than two levels of threshold sensitivities.

This adaption of button detection threshold improves detection of button actuation. In short, it is able to provide a detection threshold that is suitable or appropriate for the type of actuation. This is unlike other input devices that provide buttons with a fixed button actuation threshold for different types of actuation. A button detection threshold that is suitable for button actuation using bare fingers is often not suitable for button actuation using fingers that are covered by a glove. Similarly, a button detection threshold that is suitable for button actuation using fingers that are covered by a glove is often not suitable for button actuation using bare fingers.

Figure 4:
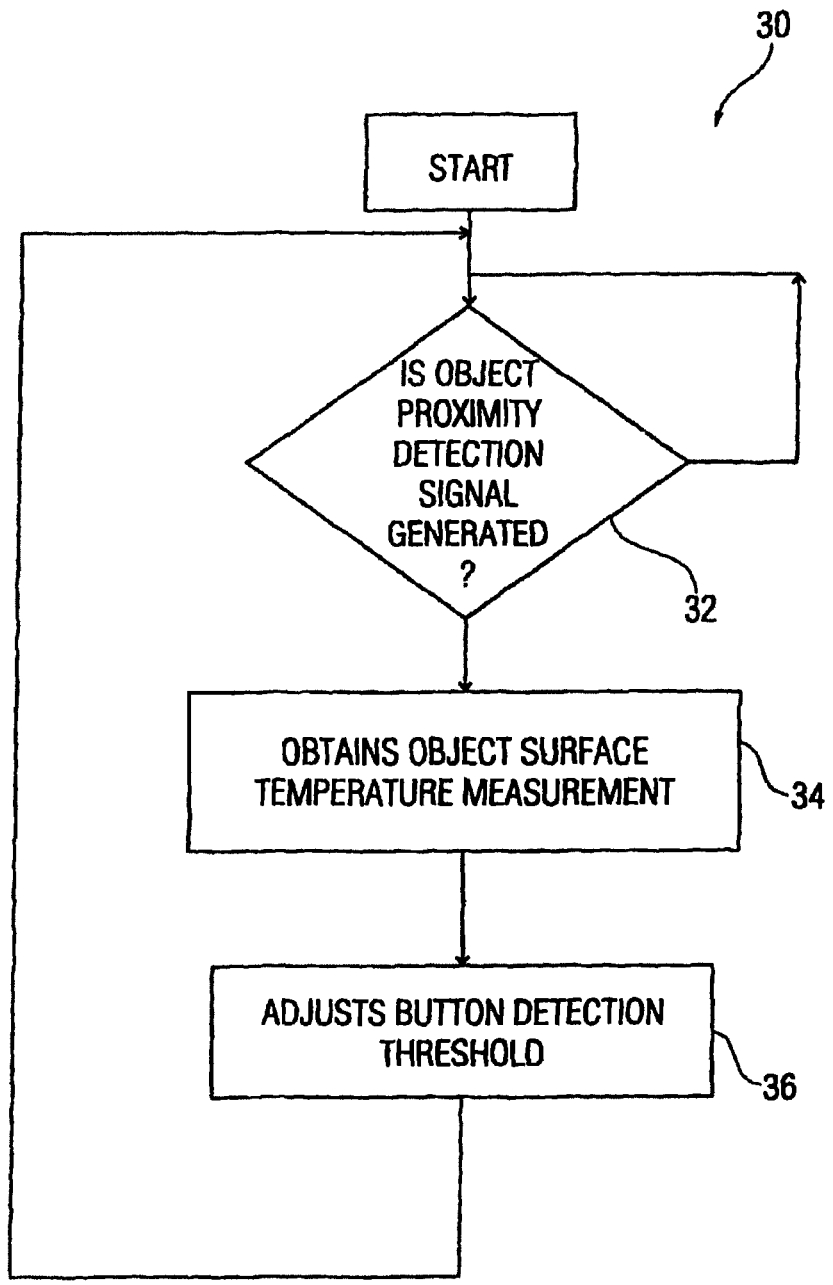
FIG. 4 illustrates a flow chart of operating the input device of the ICS of FIG. 2.

FIG. 4 shows a flow chart 30 for a possible method of operating the capacitive buttons 19.

The flow chart 30 includes a step 32 of the processor 26 checking or polling for a proximity detection signal from the proximity sensor 23. A presence of the proximity detection signal would indicate that an object is placed near one of the capacitive buttons 19.

When the processor 26 receives the proximity detection signal, the processor 26 then obtains a measurement from the IR sensor 21 in a step 34 of the flow chart 30. This measurement serves to provide a surface temperature measurement of the nearby object. The processor 26 assumes that the object is a user hand, since often only the user would place his hand near the buttons 19 for actuating the buttons 19. The processor 26 uses the surface temperature measurement to indicate whether or not the user is wearing gloves.

The processor 26 then adjusts the detection threshold according to the received surface temperature measurement and the received proximity detection signal, in a step 36 of the flow chart 30. If the received surface temperature measurement is higher than the ambient temperature, the processor 26 would assume that user is not wearing gloves, since human hands are normally warm relative to the ambient temperature. The processor 26 subsequently sets the capacitive sensitivity of the buttons 19 to high detection threshold. In other words, this enables the buttons to have low actuation sensitivity. On the hand, if the received surface temperature measurement is about the same as the ambient temperature, the processor 26 would assume that user is wearing gloves. This is because gloves often have the same surface temperature as the ambient temperature. The processor 26 later sets capacitive sensitivity of the buttons 19 to low detection threshold, wherein the buttons has high actuation sensitivity.

The detection threshold of the buttons 19 are preferably set or changed before the buttons 19 are touched or actuated by the user.

In this manner, the actuation sensitivity of the capacitive buttons 19 is improved since the actuation sensitivity is adapted according to the type of actuation.

Figure 5:
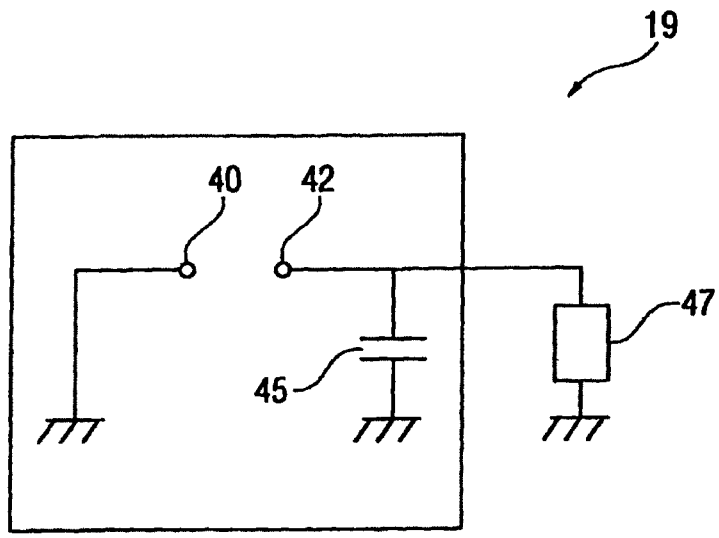
FIG. 5 illustrates an implementation of a capacitive button of the input device of FIG. 2.

FIG. 5 shows an implementation of the capacitive button 19 being connected to an actuation detection electric circuit. FIG. 5 depicts a pair of terminals 40 and 42 being connected to a charged capacitor 45 and to an actuation detection electric circuit 47. The actuation detection electric circuit 47 comprises an actuation detection threshold.

In particular, the terminal 40 is connected to the electrical ground while the terminal 42 is connected to one end of the capacitor 45 and to the actuation detection electric circuit 47. Another end of capacitor 45 is connected to the electrical ground.

In use, the terminals 40 and 42 are intended for receiving an actuation, in the form of a touch, from a user, wherein the actuation acts to electrically connect the terminal 40 to the terminal 42. This connection also serves to alter the capacitance charge of the capacitor 45 by discharging the capacitance charge through the terminals 40 and 42 to the electrical ground.

The actuation detection electric circuit 47 serves to monitor the capacitance charge of the capacitor 45. It also acts to generate an actuation signal when the altered capacitance charge of the capacitor 45 exceeds its actuation detection threshold.

Figure 7:
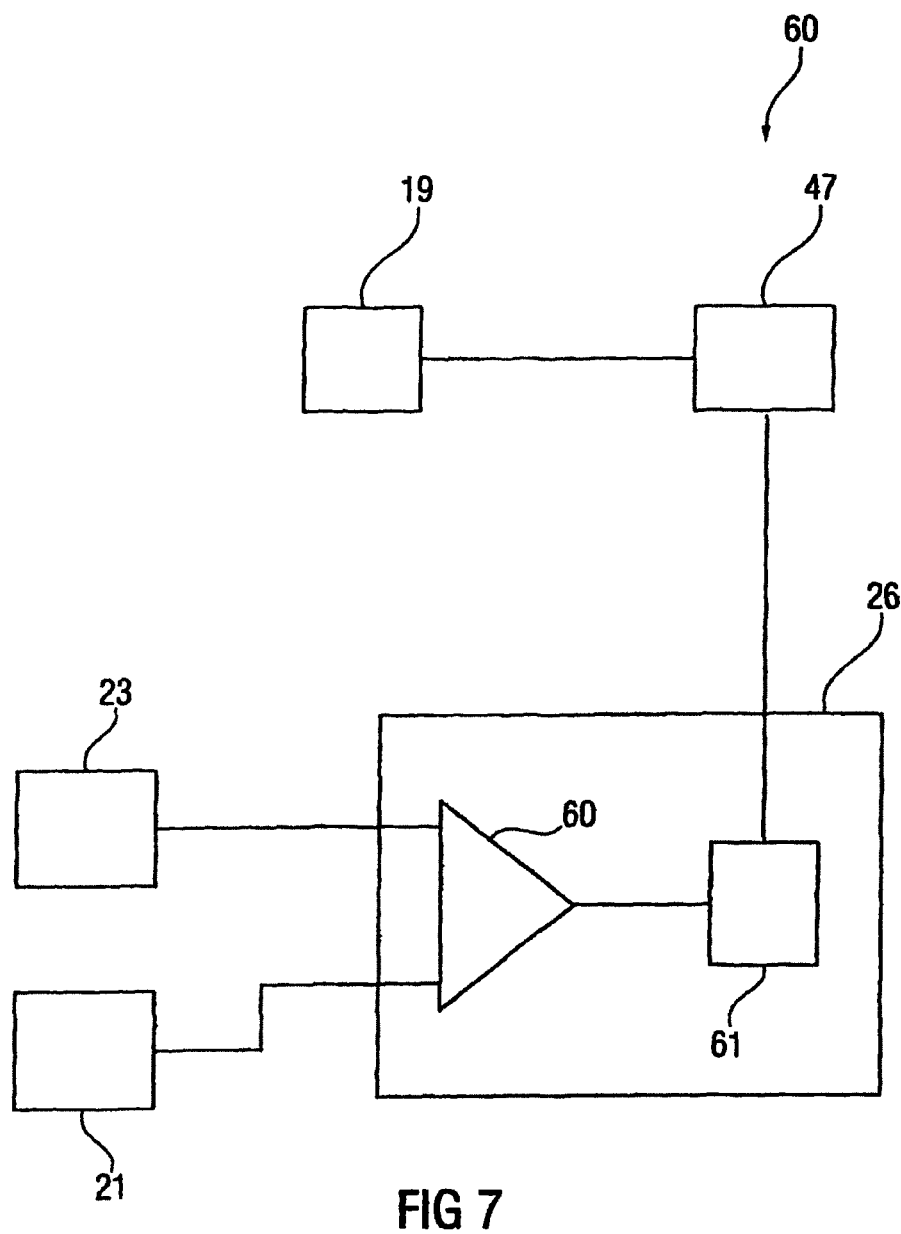
FIG. 7 illustrates a block diagram of an implementation of the input device of FIG. 2.

FIG. 7 shows a block diagram 60 of an implementation of the input device 17.

The block diagram 60 shows a processor 26 connected to a proximity sensor 23, to an IR sensor 21, and to an actuation detection electric circuit 47, which is connected to a capacitive-sensing button 19. The processor 26 includes a comparison unit 60 and an adjustment unit 61. The adjustment unit 61 is connected to the comparison unit 60.

In practice, the actuation detection electric circuit 47 and the proximity sensor 23 may have similar integrated circuits (ICs) or electrical circuits.

In use, the comparison unit 60 is intended for receiving a temperature measurement from the IR sensor 21 and for receiving a proximity signal from the proximity sensor 23. The comparison unit 60 then generates a comparison signal to the adjustment unit 61. The comparison signal is determined from the temperature measurement and from the proximity signal using a mathematical function or selecting from a table of predetermined comparison signal values.

The adjustment unit 61 is used for receiving the comparison signal from the comparison unit 60. The adjustment unit 61 later derives a threshold adjustment value from the comparison signal. The derivation can be achieved using a mathematical function or by selecting from a table of pre-determined threshold adjustment values. After this, the adjustment unit 61 changes a threshold value of the actuation detection electrical circuit 47 to the derived threshold adjustment value.

In practice, the proximity sensor 23 can use the change of capacitive charge of the button 19 for sensing presence or proximity of the nearby object. Implementation of such practice is illustrated in the next figure.

Figure 8:
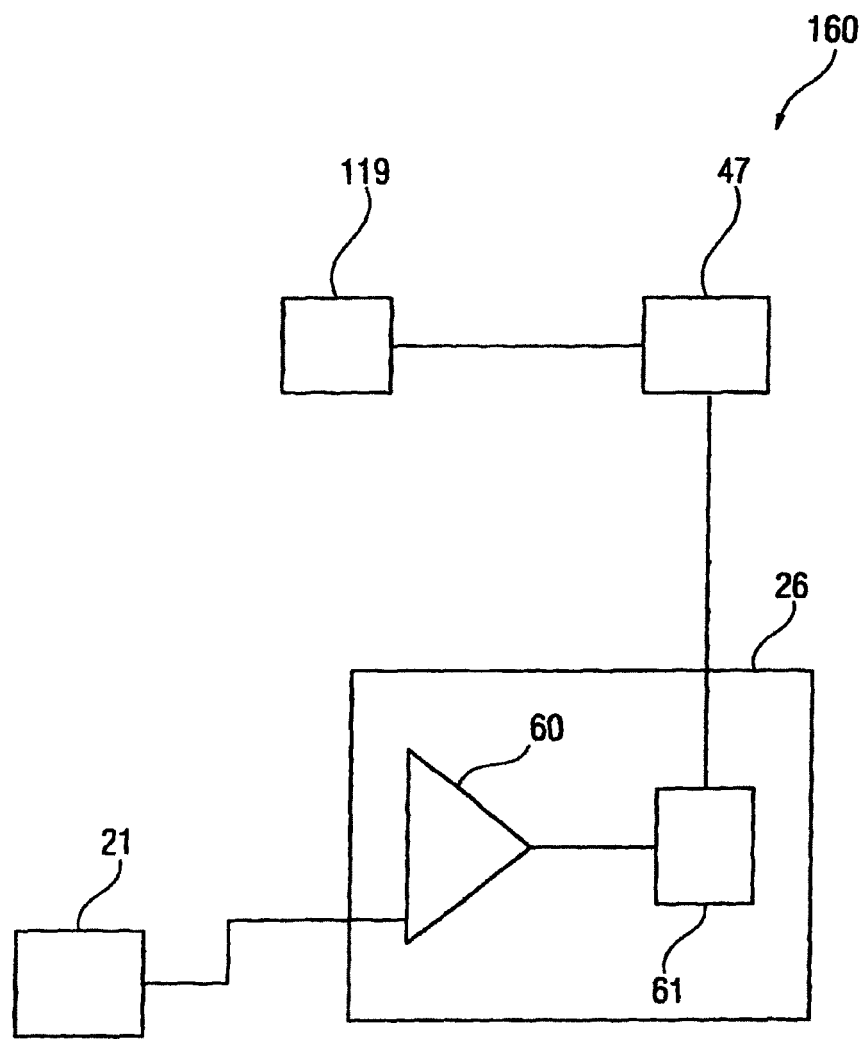
FIG. 8 illustrates a further block diagram of an implementation of the input device of FIG. 2.

FIG. 8 shows a block diagram 160 of a further implementation of the input device 17. This block diagram 160 is adapted from the block diagram 60 of the FIG. 7. Hence, the block diagrams 60 and 160 have similar parts.

The block diagram 160 replaces the capacitive buttons 19 of the block diagram 60 with integrated capacitive buttons 119. These integrated capacitive buttons 119 perform the functions of the capacitive buttons 19 and the functions of the proximity sensor 23. Hence, the proximity sensor 23 is removed from the block diagram 160.

The geometrical shape of the parts the integrated capacitive buttons 119 is adapted according for this application.

In use, these integrated capacitive buttons 119 use the change of capacitive charge of the button 119 to generate the proximity detection signal for detecting the presence or proximity of the nearby object.

In a special embodiment, the IR sensor 21 is also used for measuring internal cabin temperature of the car 10, wherein the internal cabin temperature is transmitted to a Heating, Ventilation, and Air-Conditioning (HVAC) controller. The HVAC controller then adjusts ambient temperature of the cabin according the received internal cabin temperature. The temperature adjustment is achieved by adjusting blower speed, discharge temperature and/or air distribution of the air conditioner of the car 10.

The embodiments can also be described with the following lists of features or elements being organized into items. The respective combinations of features, which are disclosed in the item list, are regarded as independent subject matter, respectively, that can also be combined with other features of the application.

An input device for a control system of a vehicle, the input device comprising at least one capacitive-sensing button, the capacitive-sensing button being provided for receiving an actuation from a user, wherein the actuation alters a capacitance value of the capacitive-sensing button, an actuation detection electrical circuit comprising a threshold value, wherein the actuation detection electrical circuit outputs a button actuation signal when the capacitance value exceeds the threshold value, a proximity sensor for generating a proximity signal when an object is provided in an area that is near the capacitive-sensing button, a proximity temperature sensor for providing a temperature measurement of the area that is near the capacitive-sensing button, and a processor comprising a comparison unit for receiving the temperature measurement and the proximity signal, wherein the comparison unit generates a comparison signal that is derived from the temperature measurement and from the proximity signal, and an adjustment unit for adjusting the threshold value to an adjustment value that is derived from the comparison signal.

The input device, wherein the capacitive-sensing button provides the proximity sensor signal.

The input device, wherein the comparison unit comprises a module for generating the comparison signal based on a predetermined mathematical comparison function of the temperature measurement and of the proximity signal.

The input device, wherein the comparison unit comprises a module for generating the comparison signal which comprises a value that is selected from a set of pre-determined comparison values based on the temperature measurement and on the proximity signal.

The input device, wherein the adjustment unit comprises a module for determining the adjustment value based on a predetermined mathematical adjustment function of the comparison signal.

The input device, wherein the adjustment unit comprises a module for selecting the adjustment value from a set of pre-determined comparison values based on the comparison signal.

The input device, wherein the comparison unit generates a pre-determined low sensitivity threshold comparison signal when the temperature measurement exceeds a temperature measurement which corresponds to an ambient temperature.

The input device, wherein the comparison unit generates a pre-determined high sensitivity threshold comparison signal when the temperature measurement is approximately the same as a temperature measurement which corresponds to an ambient temperature.

The input device, wherein the temperature measurement, which corresponds to the ambient temperature, is provided by an temperature sensor.

The input device, wherein the temperature measurement, which corresponds to the ambient temperature, is derived from the temperature measurement from the proximity temperature sensor over a predetermined period.

A control module of a vehicle comprising:

an input device according to one of the abovementioned items for receiving an actuation from a user and for outputting a button actuation signal, and a control unit that comprises a set of predetermined system function selection signals, the control unit being provided for receiving the button actuation signal from the input device and for providing a system function selection signal which is selected from the set of pre-determined system function selection signals, the selection being provided according to the button actuation signal.

A radio module of a vehicle comprising:

a control system for providing a radio function selection signal and a tuner module for receiving the radio function selection signal and for providing a radio function according to the radio function selection signal.

An air conditioning module of a vehicle comprising:

a control system for providing an air conditioning selection signal and an air conditioning unit for receiving the air conditioning selection signal and for providing an air conditioning function according to the air conditioning function selection signal.

A navigation module of a vehicle comprising a control system for providing a navigation function selection signal and a navigation unit for receiving the navigation function selection signal and for providing a navigation function according to the navigation function selection signal.

A method of operating an input device for a control system of a vehicle, the method comprising generating a proximity signal when an object is provided in an area that is near a capacitive-sensing button, obtaining a temperature measurement of the object when the proximity signal is generated, comparing the temperature measurement of the object against the ambient temperature, selecting a button actuation threshold value from a set of pre-determined threshold values according to the comparison between the temperature measurement of the object and the ambient temperature, and adjusting a threshold value of an actuation detection electrical circuit of the capacitive-sensing button according to the button actuation threshold value.

Although the above description contains much specificity, this should not be construed as limiting the scope of the embodiments but merely providing illustration of the foreseeable embodiments. The above stated advantages of the embodiments should not be construed especially as limiting the scope of the embodiments but merely to explain possible achievements if the described embodiments are put into practice. Thus, the scope of the embodiments should be determined by the claims and their equivalents, rather than by the examples given.

REFERENCE NUMBERS

10 car
12 Integrated Center Stack (ICS)
14 face plate
16 display panel
17 input device
19 capacitive button
21 infra-red (IR) sensor 23 proximity sensor
26 processor
27 integrated memory module
30 flow chart
32 step
34 step
36 step
40 terminal
42 terminal
45 capacitor
47 actuation detection electric circuit
55 temperature graph
60 block diagram
119 integrated capacitive button
160 block diagram
A viewing angle Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An input device for a control system of a vehicle, the input device comprising:
    at least one capacitive-sensing button, the at least one capacitive-sensing button being configured to receive an actuation from a user, wherein the actuation alters a capacitance value of the at least one capacitive-sensing button;
    an actuation detection electrical circuit having a threshold value, wherein the actuation detection electrical circuit outputs a button actuation signal when the sensed capacitance value exceeds the threshold value;
    a proximity sensor configured to generate a proximity signal when an object is in an area that is near the capacitive-sensing button;
    a proximity temperature sensor configured to provide a temperature measurement of the area that is near the capacitive-sensing button; and
    a processor, comprising:
        a comparison unit configured to receive the temperature measurement and the proximity signal, wherein the comparison unit generates a comparison signal that is derived from the temperature measurement and from the proximity signal, and
        an adjustment unit configured to adjust the threshold value to an adjustment value that is derived from the comparison signal,
    wherein an ambient temperature is derived by the processor from previous temperature measurements from the proximity temperature sensor, or from a second temperature sensor, over a predetermined period of time,
    wherein the comparison unit generates a pre-determined low sensitivity threshold comparison signal when the temperature measurement of the proximity temperature sensor exceeds the derived ambient temperature, and, based on the pre-determined low sensitivity threshold comparison signal, the adjustment unit changes the threshold value to a pre-determined low sensitivity threshold value, and
    wherein the comparison unit generates a pre-determined high sensitivity threshold comparison signal when the temperature measurement of the proximity temperature sensor is substantially the same as the derived ambient temperature, and, based on the pre-determined high sensitivity threshold comparison signal, the adjustment unit changes the threshold value to a pre-determined high sensitivity threshold value.

2. The input device according to claim 1, wherein the capacitive-sensing button is configured to provide the proximity sensor signal.

3. The input device according to claim 1, wherein
    the comparison unit has a module configured to generate the comparison signal based on a predetermined mathematical comparison function of the temperature measurement and of the proximity signal.

4. The input device according to claim 1, wherein
    the comparison unit has a module configured to generate the comparison signal that comprises a value selected from a set of pre-determined comparison values based on the temperature measurement and on the proximity signal.

5. The input device according to claim 1, wherein
    the adjustment unit has a module configured to determine the adjustment value based on a predetermined mathematical adjustment function of the comparison signal.

6. The input device according to claim 1, wherein
    the adjustment unit has a module configured to select the adjustment value from a set of pre-determined comparison values based on the comparison signal.

7. The input device according to claim 1, wherein
    the previous temperature measurements used to derive the ambient temperature are provided by the second temperature sensor.

8. The input device according to claim 1, wherein
    the previous temperature measurements used to derive the ambient temperature are provided by the proximity temperature sensor.

9. A control module of a vehicle comprising:
    an input device according to claim 1 configured to receive an actuation from a user and to output a button actuation signal; and
    a control unit having a set of predetermined system function selection signals, the control unit being configured to receive the button actuation signal from the input device and to provide a system function selection signal selected from the set of pre-determined system function selection signals, the selection being provided according to the button actuation signal.

10. The control module according to claim 9, wherein the control module is configured to provide a radio function selection signal to a radio of a vehicle.

11. The control module according to claim 9, wherein the control module is configured to provide an air conditioning selection signal to an air conditioning unit of a vehicle.

12. The control module according to claim 9, wherein the control module is configured to provide a navigation function selection signal to a navigation unit of a vehicle.

13. A method of operating an input device for a control system of a vehicle, the method comprising:
- generating a proximity signal when an object is provided in an area that is near a capacitive-sensing button;
- obtaining a temperature measurement in the area that is near the capacitive-sensing button when the proximity signal is generated;
- deriving an ambient temperature based upon previous temperature measurements in the area that is near the capacitive-sensing button;
- comparing the temperature measurement obtained at the obtaining step against the derived ambient temperature;
- selecting a button actuation threshold value from a set of pre-determined threshold values according to the comparison between the temperature measurement obtained at the obtaining step and the derived ambient temperature; and
- adjusting a threshold value of an actuation detection electrical circuit of the capacitive-sensing button according to the button actuation threshold value such that:
  - a low sensitivity threshold value is set when the temperature obtained at the obtaining step exceeds the derived ambient temperature, and
  - a pre-determined high sensitivity threshold is set when the temperature obtained at the obtaining step is substantially the same as the derived ambient temperature.

* * * * *